(12) United States Patent
Ikenoue et al.

(10) Patent No.: US 11,986,905 B2
(45) Date of Patent: May 21, 2024

(54) DIAMOND SMOOTHING METHOD

(71) Applicants: KYUSHU UNIVERSITY, NATIONAL UNIVERSITY CORPORATION, Fukuoka (JP); KYUSHU INSTITUTE OF TECHNOLOGY, Kitakyushu (JP); OSG CORPORATION, Toyokawa (JP)

(72) Inventors: Hiroshi Ikenoue, Fukuoka (JP); Tsuyoshi Yoshitake, Fukuoka (JP); Yuki Katamune, Kitakyushu (JP); Koki Murasawa, Toyokawa (JP)

(73) Assignees: KYUSHU UNIVERSITY, NATIONAL UNIVERSITY CORPORATION, Fukuoka (JP); KYUSHU INSTITUTE OF TECHNOLOGY, Kitakyushu (JP); OSG CORPORATION, Toyokawa (JP)

( * ) Notice: Subject to any disclaimer, the term of this patent is extended or adjusted under 35 U.S.C. 154(b) by 622 days.

(21) Appl. No.: 17/263,650

(22) PCT Filed: Aug. 1, 2018

(86) PCT No.: PCT/JP2018/028944
§ 371 (c)(1),
(2) Date: Jan. 27, 2021

(87) PCT Pub. No.: WO2020/026393
PCT Pub. Date: Feb. 6, 2020

(65) Prior Publication Data
US 2021/0299787 A1    Sep. 30, 2021

(51) Int. Cl.
*C30B 29/00*     (2006.01)
*B23K 26/00*    (2014.01)
(Continued)

(52) U.S. Cl.
CPC ...... *B23K 26/3576* (2018.08); *B23K 26/0006* (2013.01); *B23K 26/03* (2013.01);
(Continued)

(58) Field of Classification Search
CPC .............. B23K 26/3576; B23K 26/352; B23K 26/062; C30B 29/04
See application file for complete search history.

(56) References Cited

U.S. PATENT DOCUMENTS 5,483,038 A      1/1996  Ota et al.
5,504,303 A  *   4/1996  Nagy ................... B23K 26/032
                                                  219/121.68
(Continued)

FOREIGN PATENT DOCUMENTS

CN       1654158 A        8/2005
CN     105181616 A   *  12/2015
(Continued)

OTHER PUBLICATIONS

"How Does Energy Relate to Wavelength and Frequency? | Socratic." Socratic.org, socratic.org/questions/how-does-energy-relate-to-wavelength-and-frequency. Mar. 17, 2018 (Year: 2018).*
(Continued)

*Primary Examiner* — Seyed Masoud Malekzadeh
*Assistant Examiner* — Andres E. Behrens, Jr.
(74) *Attorney, Agent, or Firm* — Oliff PLC

(57) ABSTRACT

A diamond smoothing method of irradiating a laser light onto a raised and recessed surface of a diamond, so as to smooth the raised and recessed surface, by ablation that is caused to occur in the diamond by irradiation of the laser light onto the raised and recessed surface. The method includes: a threshold-energy-density detecting step of irradiating the laser light onto the raised and recessed surface, and changing an irradiation energy density of the laser light,
(Continued)

so as to detect a threshold energy density as a lower threshold value of the irradiation energy density that causes the ablation to occur; and a smoothing processing step of executing a smoothing processing by irradiating the laser light onto the raised and recessed surface with a smoothing irradiation energy density that is set to be within a range from 1 to 15 times as large as the threshold energy density.

11 Claims, 7 Drawing Sheets

(51) Int. Cl.
  B23K 26/03    (2006.01)
  B23K 26/352   (2014.01)
  B23K 33/00    (2006.01)
  C30B 29/04    (2006.01)
  C30B 33/00    (2006.01)
  C30B 33/04    (2006.01)
  B23K 103/00   (2006.01)

(52) U.S. Cl.
  CPC .............. *C30B 29/04* (2013.01); *C30B 33/04* (2013.01); *B23K 2103/50* (2018.08)

(56) References Cited

U.S. PATENT DOCUMENTS

| 2011/0220625 | A1  | 9/2011 | Pluss |
| 2018/0005883 | A1* | 1/2018 | Briggs .............. H01L 21/76894 |

FOREIGN PATENT DOCUMENTS

| CN | 105181616 A     | 12/2015 |
| CN | 107498176 A     | 12/2017 |
| DE | 10 2010 011 508 B4 | 12/2015 |
| EP | 0 716 899 B1    | 3/2002 |
| GB | 2605261 A * | 9/2022 | ......... B23K 26/3576 |
| JP | H06-040797 A    | 2/1994 |
| JP | H07-040336 A    | 2/1995 |
| JP | H07-041387 A    | 2/1995 |
| JP | H08-267259 A    | 10/1996 |
| JP | 2008207223  *   | 2/2007 |
| JP | 2008-207223 A   | 9/2008 |
| JP | 2012-176471 A   | 9/2012 |
| WO | 2008/003052 A2  | 1/2008 |

OTHER PUBLICATIONS

Wafer (Electronics)—Wikipedia. web.archive.org/web/20180207103333/https://en.wikipedia.org/wiki/Wafer_(electronics). Feb. 7, 2018 (Year: 2018).*

Simon, Roland B., et al. "Effect of Grain Size of Polycrystalline Diamond on Its Heat Spreading Properties." Applied Physics Express, vol. 9, No. 6, Japan Society of Applied Physics, May 2016, p. 061302. https://doi.org/10.7567/apex.9.061302. (Year: 2016).*

CN-105181616-A (Yonghong) Dec. 2015 (online machine translation), [Retrieved on Jul. 25, 2023]. Retrieved from: Espacenet and Google (Year: 2015).*

JP2008207223 (Suzuki) Feb. 2007 (online machine translation), [Retrieved on Jul. 25, 2023]. Retrieved from: Espacenet (Year: 2007).* https://web.archive.org/web/20171217012454/https://en.wikipedia.org/wiki/Brewster%27s_angle Dec. 17, 2017 (Year: 2017).*

Jan. 19, 2022 Office Action issued in Chinese Patent Application No. 201880096204.6.

Mar. 25, 2022 Office Action issued in German Patent Application No. 11 2018 007 873.6.

Wang et al., "Study On Site-Specific Polishing of Polycrystalline Diamond Film by KRF Excimer Laser", Journal of Laser Micro/Nanoengineering vol. 12, No. 2, pp. 62-66, (2017).

Smedley et al., "Laser Patterning of Diamond. Part I. Characterization of Surface Morphology", Journal of Applied Physics, vol. 105, pp. 123107-1~123107-5, (2009).

Oct. 23, 2018 Search Report issued in International Patent Application No. PCT/JP2018/028944.

* cited by examiner (a) BEFORE SMOOTHING PROCESSING (b) AFTER SMOOTHING PROCESSING (a) BEFORE SMOOTHING PROCESSING  (b) AFTER SMOOTHING PROCESSING (a) BEFORE SMOOTHING PROCESSING  (b) AFTER SMOOTHING PROCESSING

FIG.11

| | WAVELENGTH [nm] | INCIDENCE ANGLE θ [°] | SMOOTHING IRRADIATION ENERGY DENSITY Ef [MAGNIFICATION] | SURFACE ROUGHNESS AFTER SMOOTHING PROCESSING Ra [μm] | POLISHED AMOUNT + AFFECTED LAYER THICKNESS SUM T3 [μm] |
|---|---|---|---|---|---|
| TEST SAMPLE 1 | 193 | 0 | 1 | 0.17 | 0.4 |
| TEST SAMPLE 2 | 193 | 0 | 10 | 0.12 | 1.2 |
| TEST SAMPLE 3 | 222 | 0 | 1 | 0.14 | 0.5 |
| TEST SAMPLE 4 | 222 | 0 | 10 | 0.10 | 1.5 |
| TEST SAMPLE 5 | 248 | 0 | 1 | 0.10 | 0.5 |
| TEST SAMPLE 6 | 248 | 0 | 5 | 0.08 | 0.8 |
| TEST SAMPLE 7 | 248 | 0 | 10 | 0.08 | 1.7 |
| TEST SAMPLE 8 | 248 | 10 | 1 | 0.13 | 0.4 |
| TEST SAMPLE 9 | 248 | 20 | 1 | 0.18 | 0.4 |
| TEST SAMPLE 10 | 266 | 0 | 1 | 0.10 | 1.0 |
| TEST SAMPLE 11 | 266 | 0 | 10 | 0.09 | 1.9 |
| TEST SAMPLE 12 | 108 | 0 | 1 | 0.23 | 0.4 |
| TEST SAMPLE 13 | 248 | 30 | 1 | 0.32 | 0.3 |
| TEST SAMPLE 14 | 248 | 0 | 20 | 0.11 | 4.1 |
| TEST SAMPLE 15 | 351 | 0 | 1 | 0.15 | 2.3 |
| TEST SAMPLE 16 | 248 | 0 | 0.5 | 0.49 | 0.0 |

DIAMOND SMOOTHING METHOD

TECHNICAL FIELD

The present invention relates to a diamond smoothing method, and more particularly to such a diamond smoothing method that makes it possible to reduce a polished amount of a diamond whose surface is smoothed.

BACKGROUND ART

There are known a scaife polishing and a laser polishing as techniques of smoothing a raised and recessed surface of a diamond. The scaife polishing is a technique of polishing and removing raised portions of the raised and recessed surface so as to smooth the raised and recessed surface, by rotating a metal plate made of cast iron including abrasive grains embedded therein, and forcing the diamond onto a flat surface of the rotated metal plate. A technique of smoothing by the laser machining is, as disclosed in Patent Documents 1-4, for example, irradiating a laser light having a wavelength of about 190 nm-360 nm, onto the raised and recessed surface, and polishing and smoothing the raised and recessed surface by ablation that is caused to occur in the diamond by irradiation of the laser light onto the raised and recessed surface. Further, Patent Document 5 discloses a polycrystalline diamond film constituted by microcrystalline diamond whose crystal grain size is 10 μm or less. It is noted that "ablation" means removal or sublimation, and is, specifically, a phenomenon that a material onto which a laser light is irradiated is decomposed into molecules, atoms and plasmas, so as to be radiated.

PRIOR ART DOCUMENTS

Patent Documents

[Patent Document 1] JP-H6-40797A
[Patent Document 2] JP-H7-40336A
[Patent Document 3] JP-H7-41387A
[Patent Document 4] JP-H8-267259A
[Patent Document 5] JP-2012-176471A

SUMMARY OF THE INVENTION

Object to be Achieved by the Invention

However, in a case of smoothing by the above-described scaife polishing, a surface to be machined is limited to a flat surface, so that the scaife polishing cannot be applied to smoothing of a diamond surface that has curved or otherwise complicated shape. The laser polishing makes it possible to smooth a diamond surface that has curved or otherwise complicated shape. However, in the laser polishing, a polished amount of the diamond for the smoothing reaches a range from several tens to several hundreds of micrometers, thereby requiring, for example, formation of a diamond film including the polished amount, and accordingly requiring a long manufacturing time and a high manufacturing cost. On the other hand, although not yet known, it might be possible to reduce the polished amount, by suppressing transmission of the laser light into the diamond film so as to minimize an irradiation energy density upon irradiation of the laser light. However, a value of the irradiation energy density, which makes it possible to cause the ablation to occur, varies depending on, for example, crystal size, grade and doping elements of the diamond. If the irradiation energy density is set to a large value for satisfactorily polishing the diamond by the ablation without fail, the polished amount for the smoothing could be larger than necessary.

It is noted that the above-described problem is encountered not only in the case of polishing and smoothing the polycrystalline diamond film but also in a case of polishing and smoothing raises and recesses that are caused in flat crystal surfaces of a monocrystalline diamond as a result of abnormal grain growth or the like.

The present invention was made in view of the background discussed above. It is therefore an object of the present invention to make it possible to appropriately reduce a polished amount of a diamond, irrespective of variations of crystal size, grade, doping elements and the like of the diamond, in a case in which a raised and recessed surface of the diamond is to be smoothed by irradiating a laser light onto the raised and recessed surface.

Measures for Achieving the Object

For achieving the above object, a first invention is, in a diamond smoothing method of irradiating a laser light onto a raised and recessed surface of a diamond, so as to smooth the raised and recessed surface, by ablation that is caused to occur in the diamond by irradiation of the laser light onto the raised and recessed surface, is characterized by comprising: a threshold-energy-density detecting step of irradiating the laser light onto the raised and recessed surface, and changing an irradiation energy density of the laser light, so as to detect a threshold energy density as a lower threshold value of the irradiation energy density that causes the ablation to occur; and a smoothing processing step of executing a smoothing processing by irradiating the laser light onto the raised and recessed surface with a smoothing irradiation energy density that is set to be within a range from 1 to 15 times as large as the threshold energy density, wherein, at the smoothing processing step, the smoothing processing is executed such that a sum of a polished amount of the diamond from bottoms of recessed portions of the raised and recessed surface and a thickness of an affected layer of a polished surface after the smoothing processing, becomes 2.0 μm or less, and such that a surface roughness Ra of the polished surface becomes 0.2 μm or less.

The above-described "surface roughness Ra" is an arithmetic average roughness defined by JIS (B0601). Further, the above-described feature that "the sum of the polished amount and the thickness of the affected layer is 2.0 μm or less" means that it is preferable that a maximum value of the sums that are measured at a plurality of points is 2.0 μm or less. However, this feature encompasses also a case in which an average of the sums is 2.0 μm or less.

A second invention is, in the diamond smoothing method of the first invention, is characterized in that the diamond that is subjected to the smoothing processing is a polycrystalline diamond film which is constituted by microcrystalline diamond having a crystal grain size of 10.0 μm or less, and which has a surface roughness Ra of 3.0 μm or less.

The above-described "crystal grain size" is a maximum diameter measured in a direction perpendicular to a crystal growth direction (film thickness direction). Although it is preferable that the sizes of all of crystal grains of the diamond are 10.0 μm or less, the sizes of all of the crystal grains do not have to be 10.0 μm or less, as long as at least 80% of the crystal grains on a surface or a transverse cross section of polycrystalline diamond film are 10.0 μm or less. Further, a size of each crystal grain as measured in the crystal growth direction may be larger than 10.0 µm, as long as the crystal grain size is 10.0 µm or less.

A third invention is, in the diamond smoothing method of the first or second invention, is characterized in that the threshold-energy-density detecting step is implemented to determine whether the ablation is present by detecting a plasma current that is caused upon occurrence of the ablation.

A fourth invention is, in the diamond smoothing method of any one of the first through third inventions, is characterized in that the laser light has a wavelength that is within a range of 190-270 nm.

A fifth invention is, in the diamond smoothing method of any one of the first through fourth inventions, is characterized in that the laser light is incident onto the raised and recessed surface at an incidence angle of 25° or less.

The above-described "incidence angle" at which the laser light is incident onto the raised and recessed surface is an angle by which the laser light is inclined with respect to a direction normal to the raised and recessed surface. That is, the incidence angle is 0° in a case in which the laser light is irradiated in the direction normal to the raised and recessed surface. The direction normal to the raised and recessed surface is, for example, a direction normal to a center line of a roughness curve of the raised and recessed surface. In a case of a polycrystalline diamond film, a direction of thickness of the polycrystalline diamond film can be regarded as the direction normal to the raised and recessed surface.

Effects of the Invention

In the above-described diamond smoothing method, the threshold energy density, which makes it possible to cause the ablation to occur, is detected, and the smoothing processing is executed with the smoothing irradiation energy density that is determined based on the detected threshold energy density. It is therefore possible to appropriately execute the smoothing processing with the irradiation energy density that necessarily makes it possible to cause the ablation to occur, even if the irradiation energy density (threshold energy density) causing the ablation to occur varies depending on the crystal size, grade, doping elements and the like of the diamond.

Further, since the smoothing irradiation energy density is set to a low value that is within a range from 1 to 15 times as large as the threshold energy density, the transmission of the laser light into the diamond is suppressed, so that the raised portions of the raised and recessed surface are polished and removed with higher priority, whereby the polished surface can be smoothed to a predetermines value of the surface roughness Ra, with reduction of the polished amount from the bottoms of the recessed portions of the raised and recessed surface. That is, in the diamond that has been subjected to the smoothing processing with the low value of the smoothing irradiation energy density, crystals providing the raises and recesses in the surface disappeared, and an amorphous and gently raised and recessed surface can be obtained even with reduction of the polished amount, unlike after a mechanical polishing. Although the amorphous affected layer is formed on the polished surface after the smoothing processing, the affection is limited to only a portion in vicinity of the surface because of little transmission of the laser light into the diamond, so that the thickness of the affected layer is small. Thus, with the sum of the polished amount and the thickness of the affected layer being a small value as 2.0 µm or less, the smoothing processing can be made to obtain the surface roughness Ra of 0.2 µm or less, so that it is possible to reduce the manufacturing cost, for example, by reducing the film thickness of the diamond before the smoothing processing.

In the second invention that is directed to a case in which the smoothing processing is executed to smooth the raised and recessed surface of the polycrystalline diamond film constituted by the microcrystalline diamond whose crystal grain size is 10.0 µm or less and having the surface roughness Ra of 3.0 µm or less, the smoothing processing can be appropriately executed such that the sum of the polished amount and the thickness of the affected layer becomes 2.0 µm or less and such that the surface roughness Ra becomes 0.2 µm or less.

In the third invention, the determination as to whether the ablation is present or absent is made by detecting the plasma current that is caused upon occurrence of the ablation, so that the threshold energy density can be detected with a high accuracy in a simple manner.

In the fourth invention, the wavelength of the laser light is 270 nm or less, so that the transmission of the laser light into the diamond is suppressed whereby the polishing and removing can be appropriately made mainly in a surface layer portion of the diamond. Further, since the wavelength of the laser light is 190 nm or more, absorption of the laser light by oxygen is suppressed so that the smoothing processing by the laser light can be made in a simple manner in atmosphere.

In the fifth invention, the incidence angle of the laser light is 25° or less, so that, in a case in which the laser light is irradiated onto raised portions of the raised and recessed surface, the laser light is refracted and advanced toward inside the raised portions so as to be concentrated, and also is reflected so as to be easily irradiated onto adjacent raised portions. That is, the transmission of the laser light into the diamond and fruitless reflection of the laser light are suppressed, so that the laser light is efficiently concentrated to the raised portions of the raised and recessed surface whereby the raised portions can be efficiently polished with higher priority. Thus, it is possible to further appropriately reduce the polished amount in the smoothing processing for obtaining a predetermined value of the surface roughness Ra. For example, in case of the polycrystalline diamond film, the raised portions of the raised and recessed surface are distal end portions of the crystals, each of which has a square-pyramid shape and protrudes upwardly, and the surface of each of the crystals corresponds to plane (111), so that the laser light of the incidence angle of 25° or less is efficiently concentrated to the raised portions by the refraction or the like whereby the raised portions can be appropriately polished with higher priority.

BRIEF DESCRIPTION OF DRAWINGS

FIG. 11 is a view for explaining result of a test in which the smoothing processing was executed in various smoothing processing conditions, and a surface roughness Ra and a sum T3 of a polished amount of the diamond and a thickness of an affected layer after the smoothing processing were checked.

MODES FOR CARRYING OUT THE INVENTION

Figure 1:
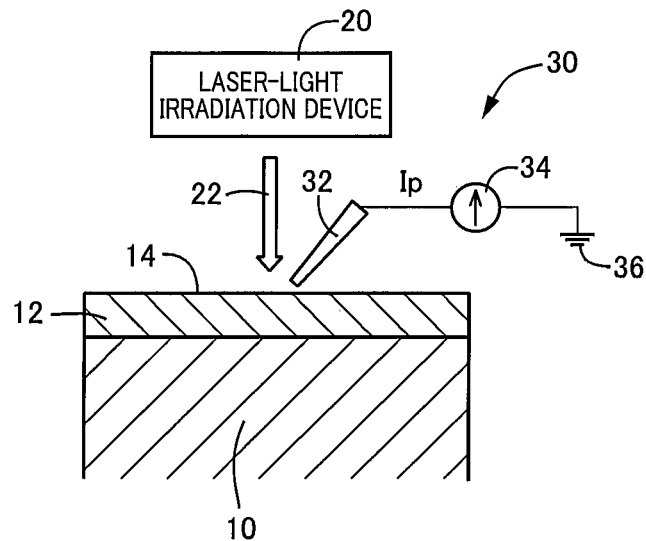
FIG. 1 is a conceptual view showing a smoothing processing for smoothing a raised and recessed surface of a polycrystalline diamond film by a diamond smoothing method of the present invention.

The diamond smoothing method of the present invention is advantageously used, for example, for smoothing a raised and recessed surface of a polycrystalline diamond film. However, the method of the present invention can be used also for polishing and removing recesses and raises (such as protrusions due to abnormal growth) caused in crystal surfaces of a monocrystalline diamond. The polycrystalline diamond film is widely used as a hard coating which is to be disposed on a cutting tool such as endmill, tap, drill and lathe cutter, a non-cutting tool required to have wear resistance such as rolling tool and die, or any one of other members. Such a diamond is prepared by using preferably, for example, a CVD (chemical vapor deposition) method such as microwave plasma CVD method, hot filament CVD method and high-frequency plasma. Since it takes a long time for growth of the crystals, in general, it is desirable to reduce a polished amount of the diamond for smoothing the surface, so as to make it possible to reduce the film thickness.

At the threshold-energy-density detecting step, the threshold energy density can be detected by making a determination as to whether the ablation is present or not, wherein the determination is made, for example, by detecting the plasma current that is caused as a result of generation of plasma from the diamond upon occurrence of the ablation, while changing the irradiation energy density in a continuous manner or a stepped manner. However, it is also possible to determine in which stage the ablation has occurred, by observing, through an electron microscope, change on a state of the surface and a cross section of the surface layer portion, while moving an irradiation position and changing the irradiation energy density. Further, the presence or absence of the ablation can be determined in any one of various manners such as luminescent analysis that is made when the plasma is generated upon occurrence of the ablation. Where a cross sectional area of the laser light is constant, an irradiation energy may be changed, as long as the irradiation energy density is changed consequently by change of the irradiation energy, so as to enable the threshold energy density to be detectable.

The threshold-energy-density detecting step may be implemented, for example, every time when the smoothing processing is to be executed for the diamond. However, where the diamond is constant in construction (namely, the crystal size, grade, doping elements and the like are constant owing to the same technique used for the preparation) and irradiation conditions of the laser light are constant, the threshold energy density is substantially constant, so that the threshold energy density does not necessarily have to be detected every time when the smoothing processing is to be executed, as long as being once detected when the smoothing processing is to be executed for the first time. At the threshold-energy-density detecting step, it is preferable that the threshold energy density is detected by changing only the irradiation energy density while the other irradiation conditions such as kind, wavelength, oscillation frequency and the incidence angle of the laser light are the same as in execution of the smoothing processing. Regarding the incidence angle, an irradiation area of the laser light is changed depending on the incidence angle θ, so that a value Y of the threshold energy density in case of the incidence angle θ≠0° can be calculated simply by Y≈X/cos θ where "X" represents a value of the threshold energy density in case of the incidence angle θ=0°.

Although the smoothing irradiation energy density is set to be within a range from 1 to 15 times as large as the threshold energy density, it is preferable that it is set to be within a range about from 1 to 10 times as large as the threshold energy density. In the smoothing processing that is executed such that the sum T3 (=T1+T2) of the polished amount T1 of the diamond from the bottoms of the recessed portions of the raised and recessed surface and the thickness T2 of the affected layer of the polished surface after the smoothing processing, is 2.0 μm or less, and such that the surface roughness Ra of the polished surface is 0.2 μm or less, it is appropriate that the crystal grain size of the polycrystalline diamond film is crystal grain size is 10.0 μm or less and the surface roughness Ra is 3.0 μm or less before the smoothing processing, and it is preferable that the crystal grain size is 5.0 μm or less and the surface roughness Ra is 2.0 μm or less before the smoothing processing. It is more preferable that the crystal grain size is 3.0 μm or less and the surface roughness Ra is 1.0 μm or less before the smoothing processing. However, the smoothing processing of the present invention can be executed also in a case in which the crystal grain size of the polycrystalline diamond film is larger than 10.0 μm. Further, the surface roughness Ra before the smoothing processing may be larger than 3.0 μm.

The affected layer of the polished surface (diamond surface) after the smoothing processing is, for example, an amorphous portion that is a graphitized portion of the diamond. In a case in which the remaining of the affected layer becomes problematic depending on purpose of use of the diamond, or in a case in which the surface is required to be further smoothed, for example, the surface may be further polished and removed, as needed, in an additional machining step. In a case in which the diamond is used for a cutting tool, the affected layer is removed as abrasion powders so that the affected layer may remain after the smoothing processing.

Since absorption of the laser light by oxygen is increased if the wavelength of the laser light is smaller than 190 nm, it is appropriate that the wavelength of the laser light is 190 nm or more and preferable that the wavelength is 220 nm or more, for execution of the smoothing processing by the laser light in atmosphere. Since an amount of transmission of the laser light into the diamond is increased if the wavelength of the laser light is larger than 270 nm, it is appropriate that the wavelength is 270 nm or less, so as to suppress affection of the laser light into the diamond. Specifically, KrCl excimer laser whose wavelength is 222 nm, KrF excimer laser whose wavelength is 248 nm, YAG laser (fourth harmonic wave) whose wavelength is 266 nm or the like is advantageously used. However, any one of the other light sources also can be used. It is also possible to use a laser light whose wavelength is smaller than 190 nm, and to use a laser light whose wavelength is larger than 270 nm. It is appropriate that the incidence angle of the laser light with respect to the raised and recessed surface is 25° or less, and it is preferable that the incidence angle is 10° or less. However, it is also possible to cause the laser light to be irradiated at the incidence angle that is larger than 25°.

Embodiment

Hereinafter, an embodiment of the present invention will be described in details with reference to the drawings.

Figure 2:
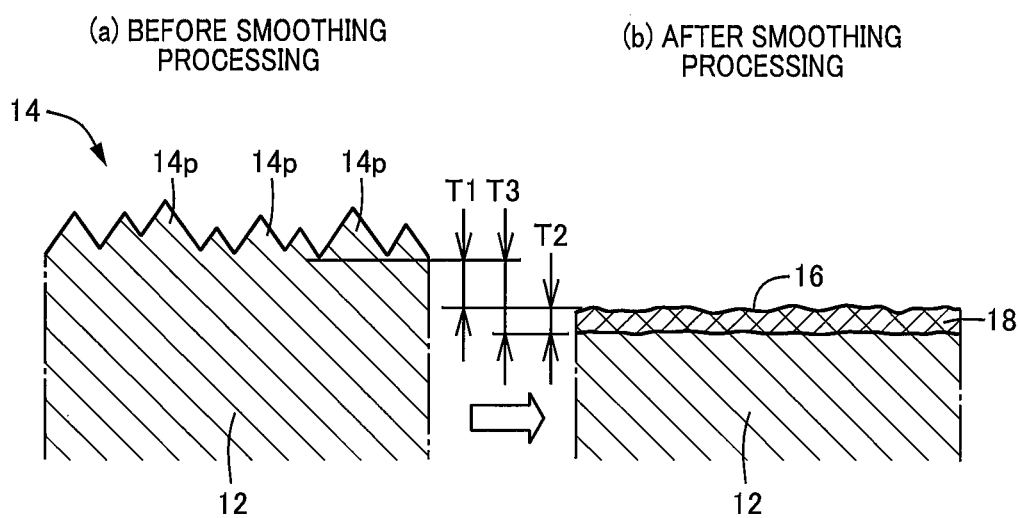
FIG. 2 is a set of conceptual views showing a cross sectional shape of the raised and recessed surface of the polycrystalline diamond film of FIG. 1 before and after the smoothing processing in a comparative manner.

FIG. 1 is a conceptual view showing a smoothing processing for smoothing a raised and recessed surface 14 of a polycrystalline diamond film 12 by using a diamond smoothing method of the present invention. The polycrystalline diamond film 12 is coated on a flat upper surface of a substrate 10 made of, for example, cemented carbide or the like. This polycrystalline diamond film 12 is formed by microwave plasma CVD method, with its crystal grain size of 10.0 μm or less and its surface roughness Ra of 3.0 μm or less. In the present embodiment, the crystal grain size is 3.0 μm or less, and the surface roughness Ra is about 0.5 μm. FIG. 2 is a set of conceptual views showing, in enlargement, a cross sectional shape of a surface layer portion of the polycrystalline diamond film 12, wherein the view (a) shows a state before execution of the smoothing processing and the view (b) shows a state after execution of the smoothing processing. In the state before the smoothing processing, a multiplicity of raised portions 14p are present in the raised and recessed surface 14, as shown in the view (a). On the other hand, a polished surface 16 after the smoothing processing has a relatively smooth raised and recessed shape, as shown in the view (b). Each of the raised portions 14p of the raised and recessed surface 14 is a distal end portion, in a crystal growth direction, of a diamond crystal having an octahedron or dodecahedron shape, and has a square-pyramid shape in most cases. The polycrystalline diamond film 12 is a diamond that is subjected to the smoothing processing.

Figure 4:
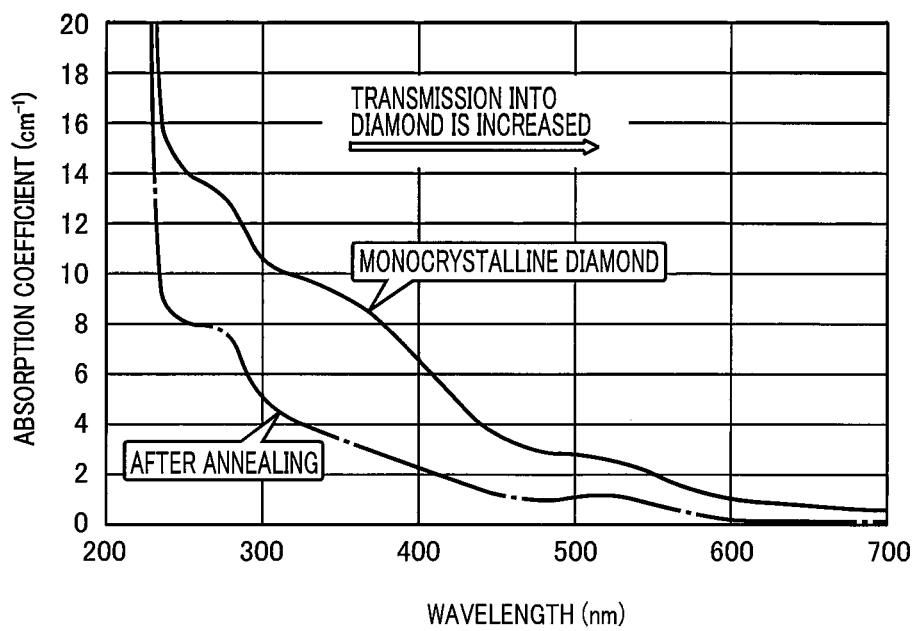
FIG. 4 is a graph showing a relationship between a wavelength of a laser light and a coefficient of absorption by the diamond.
Figure 5:
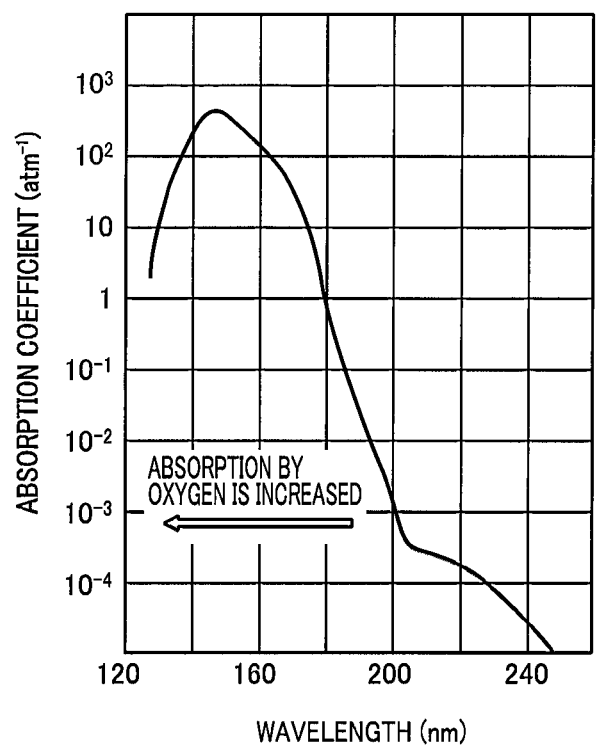
FIG. 5 is a graph showing a relationship between the wavelength of the laser light and a coefficient of absorption by oxygen.

FIG. 1 shows a laser-light irradiation device 20 that is a device configured to execute the smoothing processing by irradiating a laser light 22 onto the raised and recessed surface 14. The laser-light irradiation device 20 includes a light source (laser oscillator) for generating the laser light 22, and a cylindrical lens for concentrating the laser light 22 into a predetermined shape. The wavelength of the laser light 22 is in a range of 190 nm-270 nm, and the oscillation frequency is about 100 Hz. As the light source, for example, ArF excimer laser whose wavelength is 193 nm, KrCl excimer laser whose wavelength is 222 nm, KrF excimer laser whose wavelength is 248 nm, YAG laser (fourth harmonic wave) whose wavelength is 266 nm or the like is advantageously used. If the wavelength of the laser light 22 is smaller than 190 nm, absorption of the laser light 22 by oxygen is increased as shown in FIG. 5. Therefore, it is appropriate that the wavelength of the laser light 22 is 190 nm or more, for execution of the smoothing processing by the laser light 22 in atmosphere. Further, if the wavelength of the laser light 22 is larger than 270 nm, absorption of the laser light 22 by the diamond is reduced and accordingly an amount of transmission of the laser light 22 into the diamond is increased as shown in FIG. 4. Therefore, it is appropriate that the wavelength is 270 nm or less, so as to suppress affection of the laser light 22 into the diamond.

Figure 6:
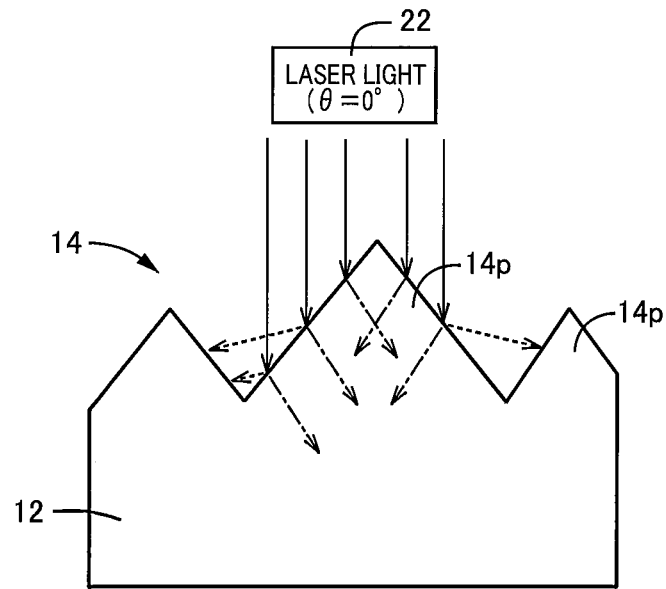
FIG. 6 is a conceptual view for explaining refraction and reflection of the laser light in a case in which the laser light is irradiated onto the raised and recessed surface of the polycrystalline diamond film at an incidence angle θ of 0°.
Figure 7:
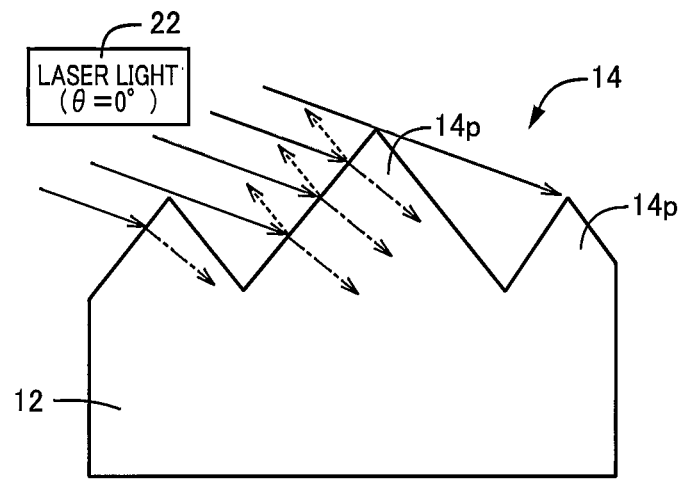
FIG. 7 is a conceptual view for explaining the refraction and the reflection of the laser light in a case in which the laser light is irradiated onto the raised and recessed surface of the polycrystalline diamond film at the incidence angle θ of 70°.

The laser-light irradiation device 20 further includes: an irradiation-energy-density adjustment device for adjusting an irradiation energy density E of the laser light 22; an incidence-angle adjustment device for adjusting an incidence angle θ of the laser light 22 with respect to the raised and recessed surface 14; and a scanning device for moving an irradiation position of the laser light 22 relative to the raised and recessed surface 14 in directions parallel to the raised and recessed surface 14. In the present embodiment, the incidence angle θ is set to a predetermined value that is 25° or less. Each of the raised portions 14p of the raised and recessed surface 14 is a distal end portion of the diamond crystal, which has the square-pyramid shape projecting mainly upwardly. Since the surface of the diamond crystal corresponds to plane (111) and is inclined by an angle of about 35° with respect to a vertical direction, the raised portions 14p can be efficiently polished by the laser light 22 of the incidence angle of 25° or less. FIG. 6 is a case in which the incidence angle θ of the laser light 22 is 0°, and in which the laser light 22 is concentrated to each of the raised portions 14p owing to re refraction (one-dot chain line) of the laser light 22 on the surfaces of each of the raised portions 14p, while reflected light (broken line) on the surfaces of each of the raised portions 14p is also incident onto the adjacent raised portions 14p, so that the raised portions 14p are efficiently polished with higher priority. On the other hand, FIG. 7 is a case in which the incidence angle θ of the laser light 22 is 70°, and in which the laser light 22 is incident onto only one-side surface of each of the raised portions 14p at an angle almost perpendicular to the surface and is not irradiated onto another-side surface of each of the raised portions 14p. Further, in the case of FIG. 7, the reflected light is moved upwardly so as not to contribute to polishing of each of the raised portions 14p, thereby resulting in poor polishing efficiency, and the laser light 22 is likely to enter inside the polycrystalline diamond film 12. In the present embodiment, a scanning velocity V is appropriately set to a value within a range of about 100-500 μm/s.

Figure 3:
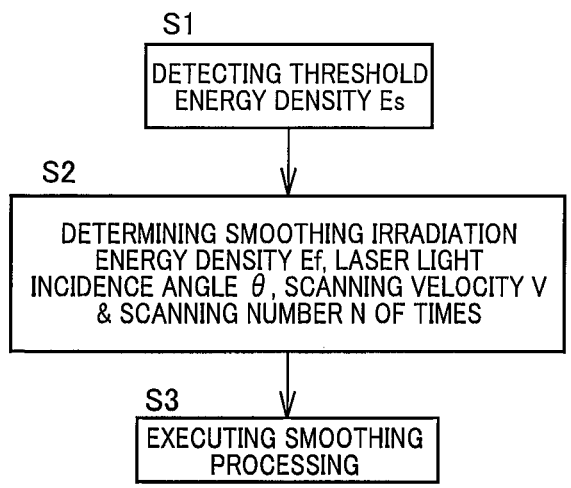
FIG. 3 is a flow chart for explaining steps implemented to execute the smoothing processing by the diamond smoothing method of the present invention, as shown in FIG. 1.

Regarding the irradiation energy density E, in the present embodiment, as shown in flow chart of FIG. 3, a threshold energy density Es is detected at step S1, and a smoothing irradiation energy density Ef is determined based on the threshold energy density E at step S2. At step S2, in addition to determination of the smoothing irradiation energy density Ef, smoothing processing conditions such as the incidence angle θ, scanning velocity V and scanning number N of times are determined by an operator. Then, at step S3, the laser-light irradiation device 20 is operated in accordance with the determined smoothing processing conditions, so that the laser light 22 is irradiated onto the raised and recessed surface 14 of the polycrystalline diamond film 12 whereby the smoothing processing is automatically executed. Step S1, which is implemented to detect the threshold energy density Es, corresponds to a threshold-energy-density detecting step. Steps S2 and S3, which are implemented to determine the smoothing irradiation energy density Ef and the other smoothing processing conditions, based on the threshold energy density Es, and to execute the smoothing processing, correspond to a smoothing processing step.

Figure 8:
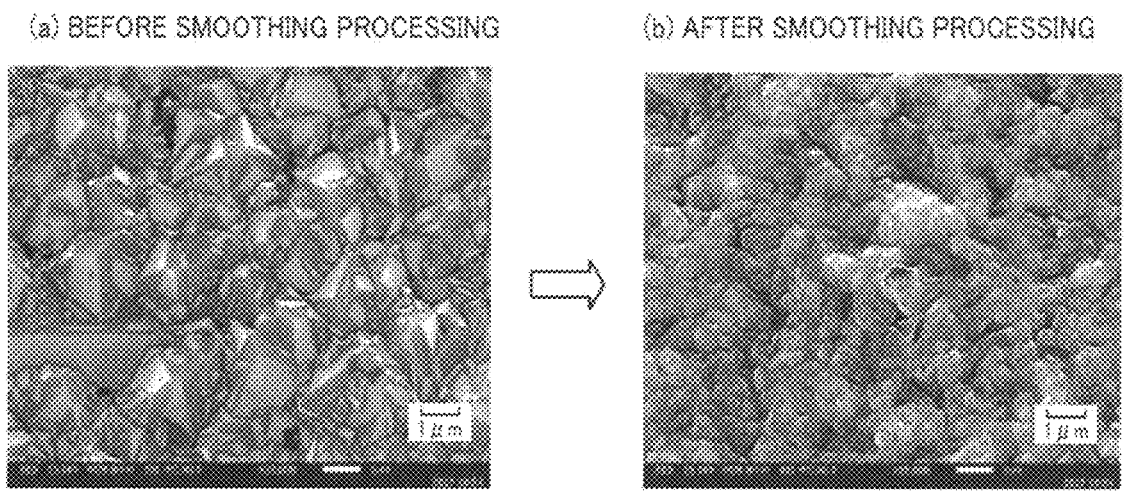
FIG. 8 is a set of views showing electron micrographs of a surface of the polycrystalline diamond film before and after the smoothing processing in a comparative manner.
Figure 9:
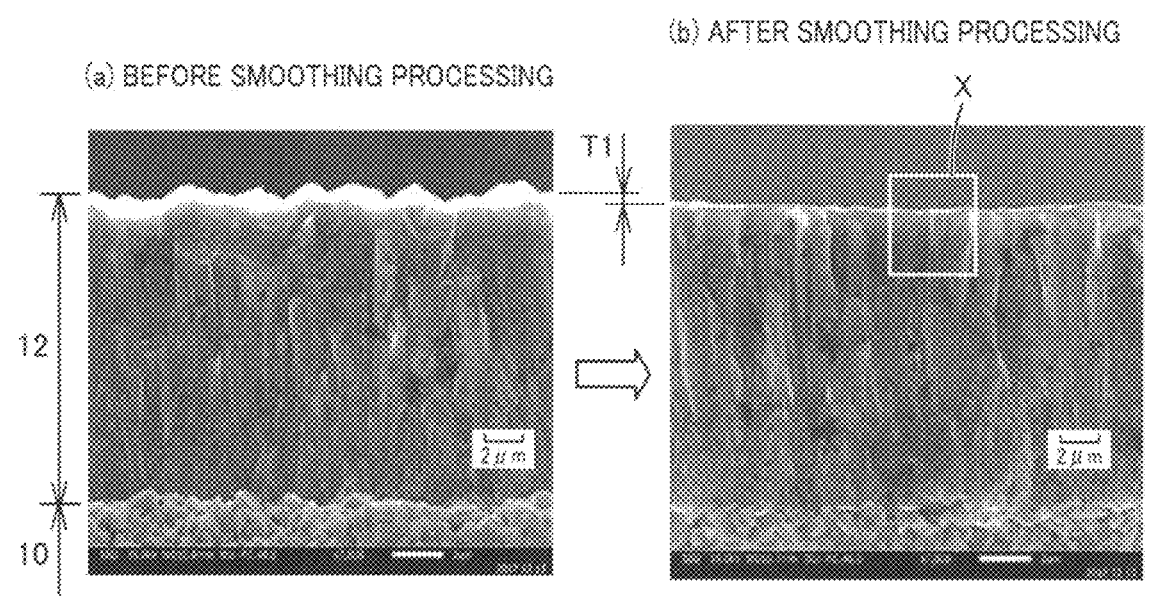
FIG. 9 is a set of views showing electron micrographs of a cross section of the polycrystalline diamond film before and after the smoothing processing in a comparative manner.
Figure 10:
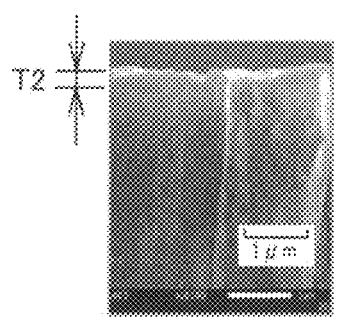
FIG. 10 is a view showing, in enlargement, part X in the view of FIG. 9 after the smoothing processing.

The polished surface 16 of the polycrystalline diamond film 12 after the smoothing processing has a gently raised and recessed shape as a result of elimination of the sharply raised portions 14p that have been present before the smoothing processing, as schematically shown in the view (b) of FIG. 2. Further, an affected layer 18, which has been affected by irradiation of the laser light 22, is formed in the surface layer portion of the polished surface 16. This affected layer 18 is an amorphous portion that is a portion of the diamond which has been graphitized by irradiation of the laser light 22. FIG. 8-FIG. 10 are electron micrographs of the actual polycrystalline diamond film 12, wherein view (a) of FIG. 8 shows the raised and recessed surface 14 before the smoothing processing, view (b) of FIG. 8 shows the polished surface 16 after the smoothing processing, view (a) of FIG. 9 shows a cross section of the polycrystalline diamond film 12 before the smoothing processing, and view (b) of FIG. 9 shows the cross section of the polycrystalline diamond film 12 after the smoothing processing. FIG. 10 is an electron micrograph showing, in further enlargement, part X in the view (b) of FIG. 9. In FIGS. 2 and 9, a dimension T1 is a distance (average value) from bottoms of the recessed portions of the raised and recessed surface 14 to the polished surface 16, and corresponds to a polished amount (polishing allowance) of the polycrystalline diamond film 12, which are removed by the smoothing processing. Further, in FIGS. 2 and 9, a dimension T2 is a thickness (average value) of the affected layer 18. A dimension T3 shown in FIG. 2 corresponds to a sum (T1+T2) of the polished amount T1 and the thickness T2 of the affected layer.

The threshold energy density Es, which is detected at the above-described step S1, is a lower threshold value of the irradiation energy density E that causes the ablation to occur, by irradiation of the laser light 22 onto the raised and recessed surface 14, and can be detected by use of an ablation detection device 30 shown in FIG. 1. The ablation detection device 30 is configured, when the laser light 22 is irradiated onto the raised and recessed surface 14 of the polycrystalline diamond film 12, to detect a plasma current Ip that is to be caused by a plasma generated upon occurrence of the ablation in the diamond, and includes a probe 32 that is constituted by a metallic bar, plate or like that has an electrical conductivity. The probe 32 is connected to a ground 36 through an ammeter 34. When the plasma is generated upon occurrence of the ablation, electron is attracted by its positive ion so as to be moved from the ground 36 to the probe 32 whereby the plasma current Ip is caused, so that the occurrence of the ablation is detected by detecting the plasma current Ip through the ammeter 34.

That is, firstly, the laser-light irradiation device 20 is set to the same irradiation conditions as in the execution of the smoothing processing at the above-described step S3. Specifically, the light source, wavelength, oscillation frequency, incidence angle θ and the like of the laser light 22 are set equally as in the execution of the smoothing processing. For example, in test sample 5 shown in FIG. 11, the KrF excimer laser whose wavelength is 248 nm is used as the light source, and the incidence angle θ is set to 0°. The oscillation frequency of the laser light 22 is 100 Hz. Then, the plasma current Ip is measured by the ablation detection device 30 while the irradiation energy density E is changed by the irradiation energy density adjustment device in a continuous or stepped manner, whereby the irradiation energy density E upon generation of the plasma current Ip is detected as the threshold energy density Es. The irradiation energy density adjustment device is capable of changing at least one of an irradiation energy amount and a cross sectional area of the laser light 22. The detection of the threshold energy density Es may be made, by determining presence or absence of the plasma current Ip through visual observation of the ammeter 34 by the operator, and then detecting the irradiation energy density E upon generation of the plasma current Ip, as the threshold energy density Es. However, it is also possible to detect the threshold energy density Es by automatically changing the irradiation energy density E in accordance with a predetermined program in an arrangement in which the laser-light irradiation device 20 and the ammeter 34 are connected to a computer or the like.

The threshold energy density Es is dependent on construction of the polycrystalline diamond film 12, so that the threshold energy density Es is substantially constant, where the crystal size, grade, doping elements and the like are constant owing to the same technique used for the preparation of the polycrystalline diamond film 12 and also the irradiation conditions such as the wavelength of the laser light 22 are constant. Therefore, in a case in which the polycrystalline diamond film 12 subjected to the smoothing processing is constant in the construction, for example, in a case in which a multiplicity of cutting tools or the like coated with the same polycrystalline diamond film 12 are subjected to the smoothing processing executed in the same irradiation conditions, the threshold energy density Es does not necessarily have to be detected every time when the smoothing processing is to be executed, as long as being once detected when the smoothing processing is to be executed for the first time. Further, where only the incidence angle θ varies, it is possible to obtain the threshold energy density Es by calculation made based on difference of the irradiation area which is due to variation of the incidence angle θ.

In the above-described step S2, the smoothing irradiation energy density Ef for execution of the smoothing processing is determined based on the threshold energy density Es. The smoothing irradiation energy density Ef is a value not smaller than the threshold energy density Es, and is set to be within a range from 1 to 15 times as large as the threshold energy density Es in the present embodiment. That is, in the present embodiment, the smoothing irradiation energy density Ef is set to the value within the range from 1 to 15 times as large as the threshold energy density Es, through experimentation that is made prior to the smoothing processing, such that the sum T3 of the polished amount T1 and affected layer thickness T2 becomes 2.0 μm or less and the surface roughness Ra of the polished surface 16 becomes 0.2 μm or less by execution of the smoothing processing.

In the diamond smoothing method of the present embodiment, the threshold energy density Es, which makes it possible to cause the ablation to occur, is detected, and the smoothing processing is executed with the smoothing irradiation energy density Ef that is determined based on the detected threshold energy density Es. It is therefore possible to appropriately execute the smoothing processing with the threshold energy density Es that necessarily makes it possible to cause the ablation to occur, even if the threshold energy density Es causing the ablation to occur varies depending on the crystal size, grade, doping elements and the like of the polycrystalline diamond film 12.

Further, since the smoothing irradiation energy density EF is set to a low value that is within a range from 1 to 15 times as large as the threshold energy density Es, the transmission of the laser light 22 into the polycrystalline diamond film 12 is suppressed, so that the raised portions 14p of the raised and recessed surface 14 are polished and removed with higher priority, whereby the polished surface can be smoothed to a predetermines value of the surface roughness Ra, with reduction of the polished amount T1 from the bottoms of the recessed portions of the raised and recessed surface 14. That is, in the polycrystalline diamond film 12 that has been subjected to the smoothing processing with the low value of the smoothing irradiation energy density Ef, crystals providing the raises and recesses of the raised and recessed surface 14 disappeared, and an amorphous and gently raised and recessed surface can be obtained as the polished surface 16 even with reduction of the polished amount T1, unlike after a mechanical polishing. Although the amorphous affected layer 18 is formed on the polished surface 16 after the smoothing processing, the affection is limited to only a portion in vicinity of the surface because of little transmission of the laser light 22 into the polycrystalline diamond film 12, so that the thickness T2 of the affected layer 18 is small, for example, about 0.5 µm or less.

Thus, with the sum T3 of the polished amount T1 and the thickness T2 of the affected layer 18 being a small value as 2.0 µm or less, the smoothing processing can be made to obtain the surface roughness Ra of 0.2 µm or less, so that it is possible to reduce the manufacturing cost, for example, by reducing the film thickness of the polycrystalline diamond film 12 before the smoothing processing. For example, in case of test sample 5 shown in FIG. 11, the smoothing irradiation energy density Ef was one time as large as the threshold energy density Es, the surface roughness Ra after the smoothing processing was about 0.10 µm, and the sum T3 of the polished amount T1 and the affected layer thickness T2 was about 0.5 µm, wherein the polished amount T1 was about 0.3 µm and the affected layer thickness T2 was about 0.2 µm.

Further, in the present embodiment, the polycrystalline diamond film 12 is constituted by the microcrystalline diamond whose crystal grain size is 3.0 µm or less, and the surface roughness Ra is about 0.5 µm, so that the smoothing processing can be appropriately executed such that the sum T3 of the polished amount T1 and the affected layer thickness T2 becomes 2.0 µm or less and the surface roughness Ra becomes 0.2 µm or less.

Further, the ablation detection device 30 is configured to detect the plasma current Ip generated upon occurrence of the ablation, namely, is capable of easily detecting presence or absence of the ablation, based on the plasma current Ip, thereby making it possible to detect the threshold energy density Es in a simple manner with high accuracy.

Further, the wavelength of the laser light 22 is 270 nm or less, so that the transmission of the laser light 22 into the polycrystalline diamond film 12 is suppressed whereby the polishing and removing can be appropriately made mainly in a surface layer portion of the polycrystalline diamond film 12. Further, since the wavelength of the laser light 22 is 190 nm or more, absorption of the laser light 22 by oxygen is suppressed so that the smoothing processing by the laser light 22 can be made in a simple manner in atmosphere.

Further, the incidence angle θ of the laser light 22 is 25° or less, so that, in a case in which the laser light 22 is irradiated onto the raised portions 14p of the raised and recessed surface 14, the laser light 22 is refracted and advanced toward inside the raised portions 14p so as to be concentrated, and also is reflected so as to be easily irradiated onto adjacent raised portions 14p. That is, the transmission of the laser light 22 into the polycrystalline diamond film 12 and fruitless reflection of the laser light 22 are suppressed, so that the laser light 22 is efficiently concentrated to the raised portions 14p of the raised and recessed surface 14 whereby the raised portions 14p can be efficiently polished with higher priority. Thus, it is possible to further appropriately reduce the polished amount T1 in the smoothing processing for obtaining a predetermined value of the surface roughness Ra.

There will be explained result of a test in which the smoothing processing was executed for the raised and recessed surface 14 of the polycrystalline diamond film 12 of each of test samples 1-16 by using a corresponding one of a plurality of smoothing methods including the smoothing method of the present embodiment, and the surface roughness Ra and the sum T3 of the polished amount T1 and the affected layer thickness T2 after the smoothing processing were checked, as shown in FIG. 11. Each of the test samples 1-11 is a product of the present embodiment, and was subjected to the smoothing processing in which the wavelength of the laser light 22 is in a range of 190-270 nm, the incidence angle θ is 25° or less, and the smoothing irradiation energy density Ef is within a range from 1 to 15 times as large as the threshold energy density Es. Each of the test samples 12-16 was subjected to the smoothing processing in which a gray part (column provided with scatter points) of the wavelength, incidence angle and smoothing irradiation energy density Ef was deviated from the corresponding requirement. The smoothing processings were executed for the respective test samples 1-16 in the same smoothing processing conditions except the wavelength, incidence angle and smoothing irradiation energy density Ef, such that the scanning velocity V was 300 µm/s, the scanning number N of times was 1, and the execution was made in atmosphere, and such that the surface roughness Ra of the polycrystalline diamond film 12 before the smoothing processing was about 0.5 µm.

For example, in the test sample 5-7, 14 and 16 in which the wavelength of the laser light 22 was 248 (nm) and the incidence angle θ was 0°, the threshold energy density Es was the same and was 3.5 (J/cm$^2$) in the present embodiment. The smoothing irradiation energy density Ef is represented as a magnification of the threshold energy density Es. In the test sample 5 in which the magnification was one time, the smoothing irradiation energy density Ef was 3.5 (J/cm$^2$). In the test samples in which values of the wavelength of the laser light 22 were different from each other, respective values of the threshold energy density Es were obtained independently of each other by use of the ablation detection device 30, and respective values of the smoothing irradiation energy density Ef were determined depending on respective values of the magnification. In the test samples in which values of the incidence angle θ of the laser light 22 were different from each other, too, respective values of the threshold energy density Es can be obtained experimentally in advance by use of the ablation detection device 30. However, a value Y of the threshold energy density in case of the incidence angle θ≠0° can be calculated in a simple manner, for example, in accordance with Y≈X/cos θ where "X" represents a value of the threshold energy density in case of the incidence angle θ=0°.

The surface roughness Ra after the smoothing processing, which is indicated in FIG. 11, is a value that was measured by a laser microscope with a wavelength of 405 nm, a measurement length of 129 µm and a cutoff of 80 µm. The surface roughness Ra before the smoothing processing also was measured in accordance with the same measuring method. The sum T3 (average value) of the polished amount T1 and the affected layer thickness T2 was measured by cross-sectional observation with use of an electron microscope. Regarding the surface roughness Ra, those which had a value of 0.2 μm or less were evaluated as successes. Regarding the sum T3, those which had a value 2.0 μm or less were evaluated as successes. Each gray part (column provided with scatter points) represents a failure. Any one of the test samples 1-11, which are products of the present embodiment, satisfies the success requirements that are the surface roughness Ra being 0.2 μm or less and the sum T3 being 2.0 μm or less.

In the test sample 12 in which the wavelength was 108 nm, it is considered that the raised and recessed surface 14 could not be appropriately polished because the absorption of the laser light 22 by oxygen was large. In the test sample 13 in which the incidence angle θ was 30°, it is considered that the raised and recessed surface 14 could not be appropriately polished because the laser light 22 was not sufficiently concentrated to the raised portions 14*p*. In these test sample 12 and 13, there is a possibility that the surface roughness Ra could be reduced to 0.2 μm or less, for example, by reducing the scanning velocity V or increasing the scanning number N of times.

In the test sample 14 in which the smoothing irradiation energy density Ef was 20 times as large as the threshold energy density Es, it is considered that the laser light 22 entered deep into the polycrystalline diamond film 12 because the smoothing irradiation energy density Ef was too large, so that the polished amount T1 and the affected layer thickness T2 became large. In the test sample 15 in which the wavelength was 351 nm, it is considered that an amount of the transmission of the laser light 22 into the polycrystalline diamond film 12 was made large so that the polished amount T1 and the affected layer thickness T2 became large. In the test sample 16 in which the smoothing irradiation energy density Ef was 0.5 times as large as the threshold energy density Es, the raised and recessed surface 14 of the polycrystalline diamond film 12 could not be polished at all because the ablation did not occur.

While the embodiment of the present invention has been described in detail by reference to the accompanying drawings, it is to be understood that the described embodiment is merely an embodied form and that the present invention can be embodied with various modifications and improvements on the basis of knowledge of those skilled in the art.

DESCRIPTION OF REFERENCE SIGNS

12: polycrystalline diamond film (diamond) 14: raised and recessed surface 16: polished surface 18: affected layer 22: laser light Es: threshold energy density Ef: smoothing irradiation energy density θ: incidence angle Ip: plasma current T1: polished amount T2: affected layer thickness T3: sum S1: threshold-energy-density detecting step S2, S3: smoothing processing step

The invention claimed is:

1. A diamond smoothing method comprising: a threshold-energy-density detecting step of detecting a threshold energy density as a lower threshold value of an irradiation energy density of a laser light that causes ablation to occur, by irradiating the laser light onto a raised and recessed surface of a diamond, and changing an irradiation energy density of the laser light; and a smoothing processing step of executing a smoothing processing by irradiating the laser light onto the raised and recessed surface with a smoothing irradiation energy density that is set to be within a range from 1 to 15 times as large as the threshold energy density, wherein, at the smoothing processing step, the smoothing processing is executed such that a sum of a polished amount of the diamond from bottoms of recessed portions of the raised and recessed surface and a thickness of an affected layer of a polished surface after the smoothing processing, becomes 2.0 m or less, and such that a surface roughness Ra of the polished surface becomes 0.2 m or less, wherein the crystal grain size is 3.0 m or less and the surface roughness Ra is 1.0 m or less before the smoothing processing.

2. The diamond smoothing method according to claim 1, wherein the threshold-energy-density detecting step is implemented to determine whether the ablation is present by detecting a plasma current that is caused upon occurrence of the ablation.

3. The diamond smoothing method according to claim 1, wherein the laser light has a wavelength that is within a range of 190-270 nm.

4. The diamond smoothing method according to claim 1, wherein the laser light is incident onto the raised and recessed surface at an incidence angle of 25° or less.

5. The diamond smoothing method according to claim 1, wherein the smoothing irradiation energy density that is set to be within a range from 1 to 10 times as large as the threshold energy density.

6. The diamond smoothing method according to claim 3, wherein the laser light has a wavelength that is within a range of 220-270 nm.

7. The diamond smoothing method according to claim 1, wherein the irradiating is carried out with a KrCl excimer laser whose wavelength is 222 nm.

8. The diamond smoothing method according to claim 1, wherein the irradiating is carried out with a KrF excimer laser whose wavelength is 248 nm.

9. The diamond smoothing method according to claim 1, wherein the irradiating is carried out with a YAG laser (fourth harmonic wave) whose wavelength is 266 nm.

10. The diamond smoothing method according to claim 1, wherein the incidence angle of 10° or less.

11. The diamond smoothing method according to claim 1, wherein the incidence angle of 0°.

\* \* \* \* \*